(12) United States Patent
Voisine

(10) Patent No.: US 7,747,400 B2
(45) Date of Patent: Jun. 29, 2010

(54) VA METERING IN POLYPHASE SYSTEMS

(75) Inventor: John Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 266 days.

(21) Appl. No.: 11/973,630

(22) Filed: Oct. 9, 2007

(65) Prior Publication Data

US 2008/0097707 A1  Apr. 24, 2008

Related U.S. Application Data

(60) Provisional application No. 60/850,144, filed on Oct. 6, 2006.

(51) Int. Cl.
*G01R 25/00* (2006.01)
*G01R 19/00* (2006.01)
*G01R 7/00* (2006.01)

(52) U.S. Cl. .......................... 702/65; 324/107; 324/141

(58) Field of Classification Search .................. 702/65, 702/57, 60–62, 64, 66–67, 127, 182, 73, 702/81, 84–85, 107, 184, 188–189, 199; 340/870.02, 870.05; 324/76.11, 76.12, 107, 324/141–142, 74, 76.13
See application file for complete search history.

(56) References Cited

U.S. PATENT DOCUMENTS

| | | | | |
|---|---|---|---|---|
| 3,024,416 A | * | 3/1962 | Becker | 324/141 |
| 4,719,557 A | * | 1/1988 | Forstbauer et al. | 363/79 |
| 4,723,220 A | * | 2/1988 | Smith-Vaniz | 702/62 |
| 4,979,122 A | * | 12/1990 | Davis et al. | 702/61 |
| 5,229,713 A | * | 7/1993 | Bullock et al. | 324/142 |
| 5,933,004 A | * | 8/1999 | Jackson et al. | 324/142 |
| 6,112,158 A | * | 8/2000 | Bond et al. | 702/61 |
| 6,121,158 A | * | 9/2000 | Benchikha et al. | 438/766 |
| 6,141,626 A | * | 10/2000 | Holdsclaw et al. | 702/60 |
| 6,374,188 B1 | * | 4/2002 | Hubbard et al. | 702/61 |
| 6,564,159 B1 | * | 5/2003 | Lavoie et al. | 702/62 |
| 6,703,823 B1 | * | 3/2004 | Hemminger et al. | 324/142 |
| 7,502,698 B2 | * | 3/2009 | Uenou et al. | 702/60 |

* cited by examiner

*Primary Examiner*—Michael P. Nghiem
*Assistant Examiner*—Toan M Le
(74) *Attorney, Agent, or Firm*—Maginot, Moore & Beck

(57) ABSTRACT

An arrangement includes an A/D converter and a processing circuit. The A/D converter is configured to generate digital samples of voltage and current waveforms in a polyphase electrical system. The processing circuit is operably coupled to receive the digital samples from the A/D converter. The processing circuit is further configured to combine a value substantially equal to two times the magnitude of the phase A current sample with the phase C current sample to generate a first value, and generate a VA calculation using the first value and at least one other value. The processing circuit is further configured to provide information representative of the VA calculation to one of a group consisting of a display, a communication circuit, and a billing calculation unit.

12 Claims, 2 Drawing Sheets

VA METERING IN POLYPHASE SYSTEMS

This application claims the benefit of U.S. Provisional Patent Application Ser. No. 60/850,144, filed Oct. 6, 2006, which is incorporated herein by reference.

FIELD OF THE INVENTION

The present invention relates generally to electricity measurements, and more particularly, to VA measurements.

BACKGROUND

One of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment.

Electricity metering often involves the measurement of consumed power or energy in the form of watts or watt-hours. Watt-hour measurements relate directly to the actual energy that the load requires. However, the amount of watts supplied to a load does not necessarily reflect the amount of energy that must be produced by the source. In particular, the amount of load watts, or load watt-hours, does not necessarily accurately relate to the size of the service (transformers size, size of power lines, etc.) needed to supply the load. This is due in part to loads that have capacitive of inductive components. In such loads, the actual energy consumption in watt-hours is significantly less than the volt-amp-hours (VA-hours) that must be produced by the energy source.

For example, consider two loads: a first load consuming 240 watts at 120 volts and which is completely resistive, and a second load consuming 240 watts at 120 volts and having a phase difference between voltage and current of 30°. Using the basic AC power consumption equation $$\text{Watts} = V_{rms} I_{rms} \cos \theta,$$

it can be seen that the first load requires 2 amps of current because I=240/(120*cos 0°), while the second load requires 2.31 amps of current because I=240/(120*cos 30°). While the actual watt-hour consumption of the second load is the same as the first load, the second load requires more current, which can affect sizing of power lines, transformers, etc. Consequently, it can be desirable to measure VA or VA-hours to determining the size of the source, i.e. transformers size, size of the power lines, etc. needed to supply the load.

To this end, in a case of a customer that consumes significantly more VA than watts, the metering of only watt-hours results in a case in which the revenue from the customer does not directly cover the customer's proportional cost of the power delivery equipment. For this reason a more complex rate structure involving VA or VA-hours is often used to recover the investment costs for such items as transformers and power lines etc. providing energy to the load. As a consequence, many electricity meters, particularly for larger non-residential loads, have at least some capability to measure VA or VA-hours.

The calculation of VA or VA-hours in single phase systems is relatively straight forward when the signals are pure sine waves. However, if harmonics are present in the power line signal, then the calculations of VA and the practical significance of the calculated VA becomes more complex.

One common method of calculating VA involves multiplying the RMS voltage by the RMS current, or in other words $VA = V_{RMS} * I_{RMS}$. Converting VA to VA-hours, as is well known in the art, merely involves integrating the VA values over time. For example, the VA value may be calculated at $\frac{1}{3}^{rd}$ second intervals, with each calculation considered to be the VA consumption over that $\frac{1}{3}^{rd}$ second, or 1/10,800 of an hour. These values are then accumulated to provide a running meter of consumed VA-hours. As such calculations are routine, the terms VA and VA-hours may be used somewhat interchangeably herein, with the understanding that VA-hours may always be calculated from VA values.

In any event, a second common method of calculating VA involves first determining the value of the reactive VA, also known as VAR (Volt Amp Reactive), and actual power in watts. The method then involves deriving VA using the formula $VA = \sqrt{\text{Watt}^2 + \text{VAR}^2}$. The VAR value may be calculated using the equation $VAR = V_{RMS} * I_{RMS} * \sin \theta$, or by sampling voltage and current and multiplying samples of voltage and current that are 90° phase separated. If harmonics are present in the power line signal, then the use of the formula $VA = \sqrt{\text{Watt}^2 + \text{VAR}^2}$ to calculate VA will yield a result that is less than that calculated from the RMS values of voltage and current, $VA = V_{RMS} * I_{RMS}$. Because of this inaccuracy, sometimes a 3$^{rd}$ quantity, distortion power (DP) is sometimes added as follows: $VA = \sqrt{\text{Watt}^2 + \text{VAR}^2 + \text{DP}^2}$.

The above equations relate generally to single phase systems. In a polyphase system, the calculation of VA is more complex and the practical significance of what is calculated goes beyond that of single phase systems. In particular, the two methods of calculating VA (or VA-hours) described above for single phase systems do not necessarily yield the same results if applied to polyphase systems even under conditions of pure sine wave signals.

In one method, VA is calculated from the RMS values of the individual phase voltages and currents for each of a polyphase system, and then the VA value for the different phases is totaled. In other words, the RMS VA of each phase is determined using $VA = V_{RMS} * I_{RMS}$ and then the total VA is calculated by simply adding the individual VA of each phase. This method of calculating VA is sometimes referred to as "RMS VA" ($VA_{RMS}$) or "arithmetic VA".

In another method, the VA is calculated using watts and VAR. In this method, the total amount of watts for all three phases is determined, and the amount of VAR for all three phases is determined. The total VA is then calculated using the formula $VA = \sqrt{\text{Watt}^2 + \text{VAR}^2}$ where Watt and VAR represent the total load watt and VAR respectively. This method of calculating VA is sometimes referred to as "vector VA" ($VA_V$). In this vector VA calculation, it is possible for the watts of any given phase to be negative and therefore subtracted from that of the other phases. This makes it possible for the total load watts to be less then the sum of the absolute value of the individual phase watts. Similarly it is possible for the total VAR value to be smaller then the sum of the absolute value of the individual phase VAR values.

The RMS method of calculating VA (i.e. arithmetic VA) is directly impacted by harmonics since the RMS value of a signal is directly impacted by harmonics. In contrast, the vector VA method of calculating VA tends to be minimally impacted by harmonics. For example, if there were only harmonics present in the current waveform and not in the voltage waveform, then the RMS value of the current would be larger than that of only the fundamental. Since the arithmetic VA ($VA_{rms}$) is the product of RMS voltage times RMS current, $VA_{rms}$ would be larger than that calculated from just the fundamental. In contrast with no harmonics present in the voltage signal the value of watts and VARs would be unaffected by the harmonics in the current signal. Consequently, the vector VA value tends to be minimally impacted by harmonics.

It is possible to derive an arithmetic VA value using watt and VAR information. If, in the formula $VA=\sqrt{Watt^2+VAR^2}$, the sum of the absolute value of watts from each phase is used and similarly the sum of the absolute value of VAR from each phase is used, then the resultant VA would be equivalent to arithmetic VA for pure sine wave signals. If it is desirable to compare arithmetic VA to vector VA with a similar influence of harmonics on both VA values, then this alternate method of calculating arithmetic VA may be desirable.

Accordingly, while metering VA or VA-hours can provide (or contribute to) a more accurate measure of the cost providing energy to a customer, there are various methods for calculating VA that provide varying measurements.

SUMMARY OF THE INVENTION

A first aspect of the invention is a meter that is operable to automatically implement an appropriate VA calculation within an electricity meter based on a user selection. The user selects whether the VA should reflect the source VA, or the load VA, and the meter automatically implements an appropriate calculation.

A second aspect of the invention is a meter that determines source VA corresponding to a load using digitally sampled voltage and current signals of a polyphase system.

At least one embodiment of the invention is an arrangement that includes an A/D converter and a processing circuit. The A/D converter is configured to generate digital samples of voltage and current waveforms in a polyphase electrical system. The processing circuit is operably coupled to receive the digital samples from the A/D converter. The processing circuit is further configured to combine a value substantially equal to two times the magnitude of the phase A current sample with the phase C current sample to generate a first value, and generate a VA calculation using the first value and at least one other value. The processing circuit is further configured to provide information representative of the VA calculation to one of a group consisting of a display, a communication circuit, and a billing calculation unit.

The above described features and advantages, as well as others, will become more readily apparent to those of ordinary skill in the art by reference to the following detailed description and accompanying drawings.

DETAILED DESCRIPTION

Figure 1:
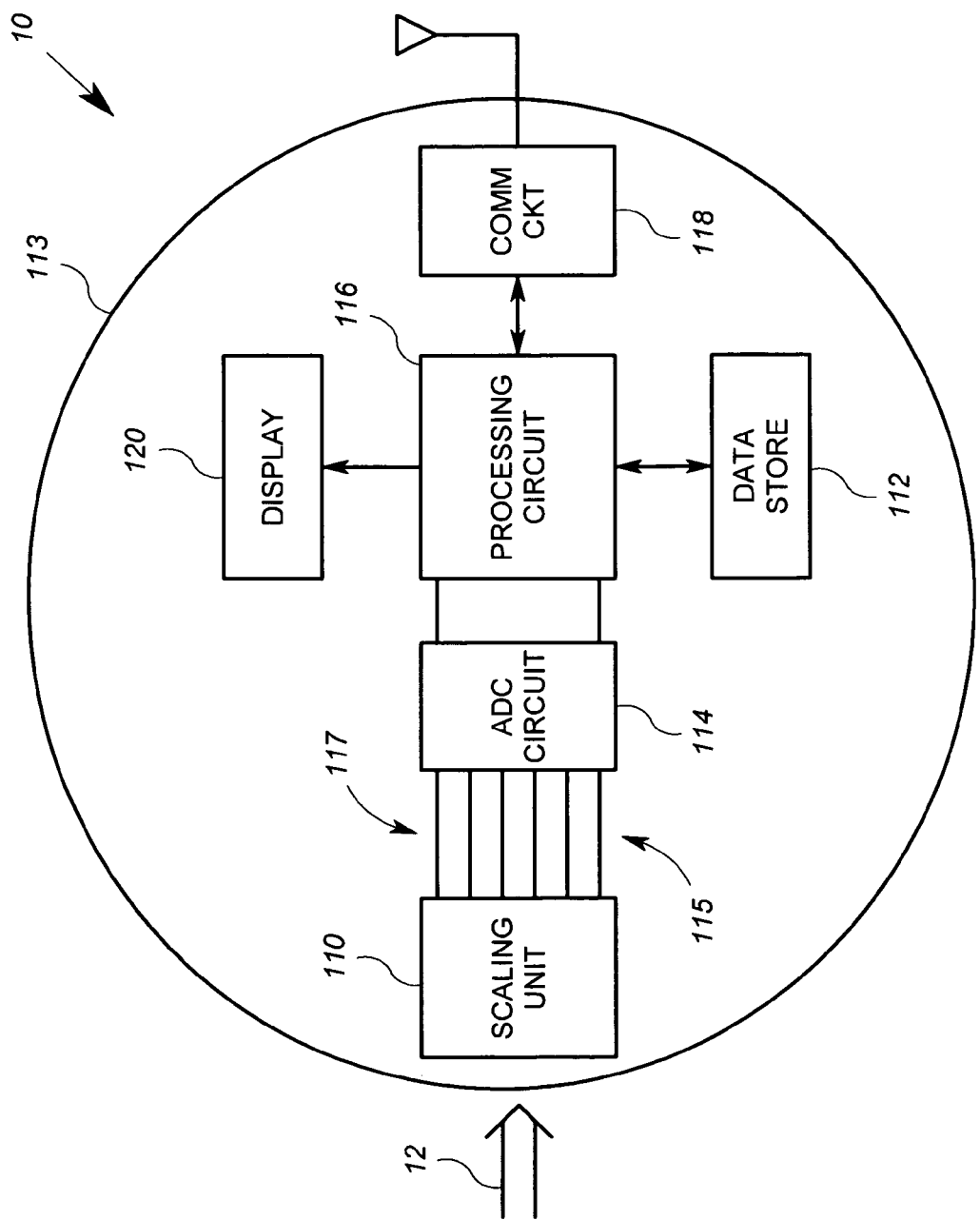
FIG. 1 shows an exemplary meter that may be used in one or more embodiments of the present invention.

FIG. 1 shows an exemplary embodiment of a polyphase electricity meter 10 in which an arrangement according the invention is implemented. Referring to FIG. 1 specifically, the metering unit 10 is an apparatus for measuring energy consumption that includes a scaling circuit 110, an analog to digital conversion ("ADC") circuit 114, a processing circuit 116, a communication circuit 118, an optional display 120 and a data store 122. All of the above listed elements are preferably supported by a meter housing 113, which may take a plurality of known forms. The communication circuit 118 may be disposed within an interior of the meter housing 113 like the other devices, or may be affixed to the outside of the meter housing 113.

In the embodiment described herein, the scaling circuit 110 and the ADC circuit 114 are arranged to generate digital signals representative of line voltage waveforms for each of three phases of an electrical system and other digital signals representative of line current waveforms for phases of an electrical system. The digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 122, or preferably some combination of the foregoing. In accordance with the embodiments described herein, the processing circuit 116 is further operable to perform any or all of the VA calculations described herein.

In one embodiment, the processing circuit 116 is configured (i.e. programmed and/or arranged) to generate a first VA calculation if configuration data identifies that a source VA calculation is selected, the first VA calculation providing a determination of a VA quantity that more accurately represents a source VA than a corresponding determination of a second VA calculation. The processing circuit 116 is also configured to generate a second VA calculation if the configuration data identifies that load VA is selected, the second VA calculation providing a determination of a VA quantity that more accurately represents a load VA than a corresponding determination of the first VA calculation. The configuration data identifying whether a source VA or load VA is to be calculated may suitably be stored in the data store 122 or other memory, or merely be stored in a buffer or register that receives user input or a communication input. The processing circuit 116 is further operable to provide the VA calculation to one of a group consisting of the display 120, the communication circuit 118, and a billing calculation unit within the processing circuit 116 or elsewhere.

In further detail, the scaling circuit 110 may suitably comprise current and voltage sensors, not shown. The voltage sensors, which may, for example, include voltage dividers, generate a scaled down version of the voltage present on phases of the power lines 12. The current sensors, which may suitably include current transformers, shunts, embedded coil devices and the like, generate a voltage or current signal that is a scaled down version of the current present on the phases of the power lines 12. Various voltage and current sensors are known in the art.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. No. 6,374,188; U.S.

Pat. No. 6,564,159; U.S. Pat. No. 6,121,158 and U.S. Pat. No. 5,933,004, all of which are incorporated herein by reference.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Watts = \Sigma V_n * I_n.$$

where Watts is actually an energy value (i.e. watt-hours).

In addition, the processing circuit 116 preferably calculates VA using one or more of the methods described herein. Thus, the processing circuit 116 may generate watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. No. 6,374,188; U.S. Pat. No. 6,564,159; U.S. Pat. No. 6,121,158 and U.S. Pat. No. 5,933,004.

In accordance with one embodiment, the processing circuit 116 is configured to prompt the user to select either "source VA" or "load VA", or some other indication that VA is to be calculated from the perspective of the electricity source, or from the perspective of the load. The prompting may occur via interactive display using the display 120 and the communication circuit 118, or by other means. For example, the meter 10 may be configured in a configuration facility, not shown, but which are known in the art, where configuration information (e.g. types of measurements to be taken, display features and/or calibration information) is programmed to a memory (i.e. data store 122). In accordance with some embodiments of the invention, the configuration operation would further include selection of "source VA" or "load VA". To this end, the meter display 120 (or an external configuration device display, not shown) would provide the user with a selection of whether a VA calculation should be one that is representative of "source VA", or whether the VA calculation should be one that is representative of "load VA". The user would then program the meter with a selection based on whether source VA or load VA is desired.

When the meter 10 is subsequently installed for use, the meter 10 performs a VA determination based on the stored configuration information of the user selection. If the user had selected source VA, then the processing circuit 116 automatically configures its metering operation to perform an arithmetic VA calculation. If, however, the user had selected load VA, then the processing circuit 116 automatically configures its metering operation to perform a vector VA calculation.

The processing circuit 116 is further operable to store the plurality of energy consumption values in the data store 122. In some embodiments, the processing circuit 116 may store energy consumption values for each of plurality of time periods, in order to allow analysis of energy usage at different times of day, days of the week or month, or even seasonally. The storage of consumption indexed to time periods is often referred to in the industry as "load profiling". The data store 122 may suitably be a random access memory, EEPROM, other memory, or a combination of several types. In still other embodiments, the data store 122 may include a circular buffer, FIFO device, or other memory that stores data in the order in which it is received. Other known methods may be used.

The communication circuit 118 is a device that is in some embodiments configured to communicate data between the metering unit 12 and one or more remote devices. In a system such as that shown in FIG. 1, the communication circuit 118 would be operable to communicate directly or indirectly with a data collection system of a utility service provider. Several of such systems are known. The utility service provider then uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range.

In addition or in the alternative, the communication circuit 118 is configured to communicate with a locally coupled device, such as a reed, switch, portable, computing device, or other device. The communication circuit 118 may include an optical or electrical data port, not shown, for this purpose.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

As discussed above, the processing circuit 116 in one embodiment is configured to generate a selected one of a source VA value or a load VA value. This value may be used for billing purposes, for planning purposes and/or other analysis purposes. The VA value may be blended with other values, such as watt-hours or watts, or even reactive power.

As also discussed above, if a source VA is to be implemented, then the processing circuit 116 performs an arithmetic VA calculation. If a load VA is to be implemented, then the processing circuit 116 performs a vector VA calculation. The vector VA is a fundamentally different calculation compared to arithmetic VA and sometimes yields different results. For example, reference a 120 volt 4 wire 'Y' service with a single resistor connected between two phases as shown in FIG. 2.

Figure 2:
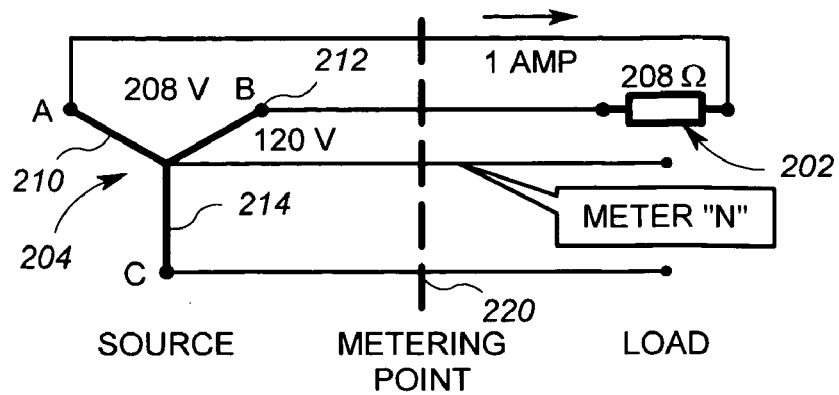
FIG. 2 shows a measurement arrangement in which an embodiment of the invention may be employed.

FIG. 2. shows a 208 ohm resistive load 202 coupled between two phases of a three phase electrical service 204. The electrical service includes a phase A 210, a phase B 212, and a phase C 214, each at 120 volts RMS with respect to neutral, and each separated by 120° of phase. A meter such as the meter 10 of FIG. 1 is electronically connected at the metering point 220 between the electrical service 204 and the load 202.

The processing circuit 116 may suitably calculate load watts by multiplying the voltage vector of each phase with the current vector of each phase. Using sampling, the processing circuit 116 may suitably perform the following calculations:

$$Watt_a = \Sigma(V_{an} * I_{an})$$

$$Watt_b = \Sigma(V_{bn} * I_{bn})$$

$$Watt_c = \Sigma(V_{cn} * I_{cn})$$

$$Watt = Watt_a + Watt_b + Watt_c$$

wherein $V_{xn}$ is the sampled voltage at a time n on phase x at the metering point 220, and $I_{xn}$ is the sampled current at a time n on phase x at the metering point 220. In the above equations, the term Watt is actually an energy measurement in terms of watt-hrs.

The processing circuit 116 may suitably calculate vector (or load) VARs using the equation using 90 phase degree delayed current measurements.

$$VAR_a = \Sigma(V_{an} * I_{an-90})$$

$$VAR_b = \Sigma(V_{bn} * I_{bn-90})$$

$$VAR_c = \Sigma(V_{cn} * I_{cn-90})$$

$$VAR = VAR_a + VAR_b + VAR_c$$

With these two values, the vector VA may be calculated as:

$$VA = \sqrt{Watt^2 + VAR^2}$$

On the other hand, the processing circuit 116 may calculate source VA or arithmetic VA using the equations:

$$VA_a = V_{RMSa} * I_{RMSa}$$

$$VA_b = V_{RMSb} * I_{RMSb}$$

$$VA_c = V_{RMSc} * I_{RMSc}$$

$$VA = VA_a + VA_b + VA_c$$

It can be seen that source VA or arithmetic VA does not equal load VA or vector VA in this case. At the source, phase A 210 and phase B 212 each provide 120 volts, and 1 amp of current. Thus, using the arithmetic VA calculation, the source VA is 240 volts-amperes. However, the vector VA or load VA yields a value of 208, because the watts are 208 (because of the resistive load 202) and the VAR is 0. Thus, VA=the square root of $(208)^2 + (0)^2$ or 208.

The processing circuit 116 makes these two calculations available because even in this example the vector VA does not equal the arithmetic VA for a simple load consisting of a single resistor. It has been determined that the reason for this difference is that the two methods of determining VA actually provide different information about the system. The arithmetic VA calculation actually provides information regarding the size of the source needed to supply the load. By contrast, the vector VA calculation provides information about the actual VA of the load. It is important to note that the law of the conservation of energy only applies to true physical energy, i.e. watts. VA, however, is not true physical energy, but rather a mathematical tool used by the electrical utility industry to help understand certain aspects of an electrical system.

Thus, the meter 10 in one embodiment provides the opportunity for a user to select whether a VA component of a metering calculation is to be determined as source VA or load VA. Source VA, as the name implies, relates to the size of the source needed to supply the load. By contrast, load VA relates to the VA of the load itself. The fact that source VA is not equal to load VA is an indication that the particular service type is not effectively matched to load in terms of the size or capacity of the source. In the preceding example, a smaller energy source could supply the same load if the source employed a single transformer. In other words, the source is not efficiently matched to the load. Specifically, a single phase load is most efficiently supplied using a single phase source, and a three phase load is most efficiently supplied using a three phase source. In the above example, if a single transformer were used, then the load could be supplied by a 208 VA transformer. However, because two 120 volt transformers with a 120 degree phase shift between them are used, the source must have a capacity of 240 VA to provide a load of only 208 VA.

To reply to the position that only source VA is of relevance to an electric utility, consider the following. The utilities' customer has control of load and hence the load VA. The utility has control of the source and hence source VA. If the rate structure an electric utility applies to a customer incorporates VA, then the customer may try to control the VA of his load and hence load VA to manage his usage. It could be argued that it is not necessarily the customer's responsibility to determine the service type the utility installs to supply the load. If the utility incorrectly installs a three phase service and the customer only uses a single phase load, then it may be argued that the charges should be based on the load VA and not the source VA. However, it is also possible that the customer should not only be encouraged to reduce the load VA, but also to balance the load so that the source VA is also at a minimum.

Ultimately, the decision on which measure of VA is appropriate will lie in the various users of this embodiment of the meter 10, namely the energy providers and/or energy users.

A further embodiment of the invention implements the processing circuit 116 to generate separate source VA and vector VA measurements in a three wire delta polyphase system metered using a two phase meter. In a such an environment, the calculation of source VA is different than for a 4 wire 'Y' system. At present, one method used by some two phase meters is to sum the product of each of the phase currents with the respective line to line voltage. For example, referencing FIG. 3:

$$VA_{RMS} = \frac{\sqrt{3}}{2}[|V_{AB}| \cdot |I_A| + |V_{CB}| \cdot |I_C|].$$

The factor $$\frac{\sqrt{3}}{2}$$

is a correction factor employed so that for a balanced load and sine wave signals $VA_{RMS}$ equals the vector VA. Calculating source VA in this manner is only valid if the load is balanced.

An embodiment of the present invention, however, determines source VA in a three wire delta system that is accurate for both balanced and unbalanced loading conditions. This embodiment provides a method of determining source VA that would be relatively easy to implement in the meter 10, and indeed in any suitable digital electricity meter.

Figure 3:
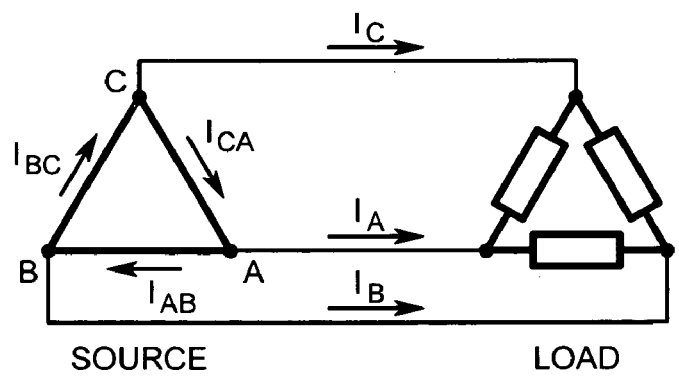
FIG. 3 shows another measurement arrangement in which an embodiment of the invention may be employed.

Referring to FIG. 3, derivation of source VA in a 3 Wire Delta System is discussed herebelow.

Assumptions:
Meter neutral is connected to Phase B. Measured quantities are therefore $V_{CB}$, $V_{AB}$, $I_A$, and $I_C$.
Source voltages and source impedances are matched. Consequently:

$$\vec{I}_{AB} + \vec{I}_{BC} + \vec{I}_{CA} = 0$$

A scalar quantity is illustrated using a symbol such as A

A vector quantity is illustrated using a symbol such as $\vec{A}$

Derived "source VA" from measured quantities:

$$\vec{I}_{AB} = -\frac{1}{3}(2\vec{I}_A + \vec{I}_C)$$

$$\vec{I}_{BC} = \frac{1}{3}(\vec{I}_A + 2\vec{I}_C)$$

$$\vec{I}_{CA} = \frac{1}{3}(\vec{I}_A + \vec{I}_C)$$

$$VA_{Source} = \frac{1}{3}[|\vec{I}_A + 2\vec{I}_C| \cdot |\vec{V}_{CB}| + |2\vec{I}_A + \vec{I}_C| \cdot |\vec{V}_{AB}| + |\vec{I}_A - \vec{I}_C| \cdot |\vec{V}_{AB} - \vec{V}_{CB}|]$$

The calculation of vector summations or subtractions can be accomplished by performing trigonometric calculations and accounting for the magnitude and phase information of each vector. Such trigonometric calculations would yield accurate results for pure sine wave signals. Calculations involving the product of absolute values (RMS) can use simple scalar arithmetic.

The accuracy of using trigonometric methods of adding or subtracting vectors degrades if harmonics are present because such methods are based on the assumption of the signals being pure sine waves. Moreover, performing trigonometric calculations and accounting for the magnitude and phase of each vector requires a significant degree of computational power which may be cost prohibitive in a high volume electricity metering product.

To overcome the disadvantages of performing trigonometric calculations mentioned above, the addition of vector quantities can be accomplished directly on sampled data. For example the addition of $\vec{I}_A + 2\vec{I}_C$ can be accomplished by simply adding each digitally sampled data point of $I_A$ with 2 times each digitally sampled data point of $I_C$. This method of adding vector quantities is accurate in the presence of harmonics and requires significantly less computational power compared to standard trigonometric calculations.

The absolute value quantities in the above equation represent the RMS value of the waveform. RMS quantities are calculated by performing a square root operation on the sum of the squares of the sampled data. The RMS value of $\vec{I}_A + 2\vec{I}_C$ would be obtained by performing the following calculation.

$$RMS = \sqrt{\frac{1}{N}\sum_{1}^{N}(I_{An} + 2I_{Cn})^2}$$

where N is the number of samples over which the RMS calculation is performed and n is the specific sampled point.

Figure 4:
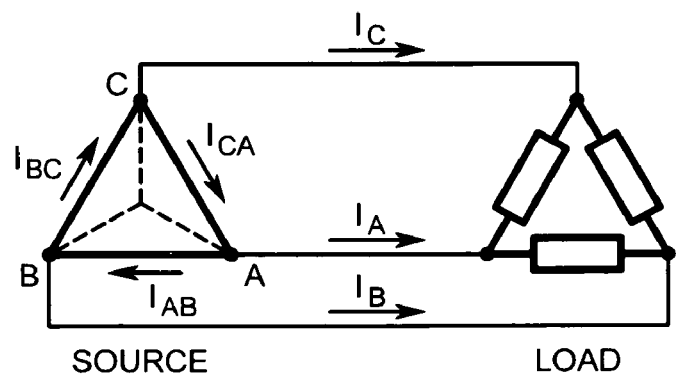
FIG. 4 illustrates a variation of a measurement arrangement of FIG. 3.

An alternate approach to determining source VA in a three wire delta system is to perform calculations as if the source were a 'Y' network having a floating neutral. This is sometimes referred to as being an inscribed 'Y' and is shown in FIG. 4 as dotted lines inside the delta source. Whether the source is made up of three 240 volt transformers connected in a delta configuration or three 138.6 volt transformers connected in a floating neutral 'Y' configuration: the total VA capacity of the source would be the same.

$$VA_{Source} = \frac{1}{3}[|2\vec{V}_{AB} + \vec{V}_{CB}| \cdot |\vec{I}_A| + |2\vec{V}_{CB} - \vec{V}_{AB}| \cdot |\vec{I}_C| + |\vec{I}_A + \vec{I}_C| \cdot |\vec{V}_{CB} + \vec{V}_{AB}|]$$

Analogous to the equation for a 3 wire delta source, the above equation gives source VA for a 3 wire floating neutral 'Y' source. Again the calculation of source VA can be implemented relatively easily in a digital meter if the addition or subtraction of vector quantities is accomplished directly on sampled data.

It will be appreciated that once the processing circuit 116 of the meter 10 determines source VA and/or load VA, as well as any other energy consumption-related values, it provides the values to the display 120 or to the communication circuit 118 for transmission to an external device. In some cases, the processing circuit 116 provides the VA information to a billing calculation unit (such as a billing formula implemented by the processing circuit itself) so that billing calculations may be made, for example, in a conventional manner.

The invention claimed is:

1. An arrangement, comprising:
   a) an A/D converter configured to generate digital samples of voltage and current waveforms in a polyphase electrical system;
   b) a processing circuit operably coupled to receive the digital samples from the A/D converter, the processing circuit configured to:
      i) generate a VA calculation using the following relationship $$VA_{Source} = \frac{1}{3}[|\vec{I}_A + 2\vec{I}_C| \cdot |\vec{V}_{CB}| + |2\vec{I}_A + \vec{I}_C| \cdot |\vec{V}_{AB}| + |\vec{I}_A - \vec{I}_C| \cdot |\vec{V}_{AB} - \vec{V}_{CB}|]$$

where $\vec{I}_A$ is the current vector on phase A, $\vec{I}_C$ is the current vector on phase C, $\vec{V}_{CB}$ is the voltage vector across phase C and phase B, and $\vec{V}_{AB}$ is the voltage vector across phase A and phase B;
      ii) provide information representative of the VA calculation to one of a group consisting of a display, a communication circuit, and a billing calculation unit.

2. The arrangement of claim 1, wherein the processing circuit is further configured to generate a first value representative of $\vec{I}_A + 2\vec{I}_C$ at least in part by combining a value substantially equal to two times the magnitude of a phase C current sample with a phase A current sample.

3. The arrangement of claim 2, wherein the processing circuit is further configured to generate a second value representative of $\vec{V}_{CB}$ based at least in part on phase C voltage samples.

4. The arrangement of claim 3, wherein the processing circuit is further configured to generate a value representative of a product of the first value and the second value.

5. The arrangement of claim 1, wherein the processing circuit is further configured to generate a first value representative of $2\vec{I}_A + \vec{I}_C$ by combining two phase A current samples with a phase C current sample.

6. The arrangement of claim 1, further comprising the display, and wherein the display is configured to display the information representative of the VA calculation.

7. An arrangement, comprising:
a) an A/D converter configured to generate digital samples of voltage and current waveforms in a polyphase electrical system;
b) a processing circuit operably coupled to receive the digital samples from the A/D converter, the processing circuit configured to:
  i) generate a first value at least in part by combining a value substantially equal to two times the magnitude of a phase C current sample with a phase A current sample;
  ii) generate a VA calculation using the first value and at least one other value;
  iii) provide information representative of the VA calculation to one of a group consisting of a display, a communication circuit, and a billing calculation unit.

8. The arrangement of claim 7, wherein the processing circuit is further configured to combine two phase A current samples with the phase C current sample to generate one of the at least one other values.

9. The arrangement of claim 7, wherein the processing circuit is further configured to generate a second value representative of a voltage difference between phase C and phase B based at least in part on phase C voltage samples.

10. The arrangement of claim 9, wherein the processing circuit is further configured to generate a value representative of a product of the first value and the second value.

11. The arrangement of claim 7, further comprising the display, and wherein the display is configured to display the information representative of the VA calculation.

12. The arrangement of claim 7, further comprising the communication circuit.

* * * * *